United States Patent

Andrews, Jr.

[15] 3,665,218

[45] May 23, 1972

[54] CONTROL CIRCUIT FOR INSULATED GATE FIELD EFFECT TRANSISTORS

[72] Inventor: John Marshall Andrews, Jr., Allentown, Pa.

[73] Assignee: Bell Telephone Laboratories, Incorporated, Murray Hill, Berkeley Heights, N.J.

[22] Filed: Oct. 30, 1970

[21] Appl. No.: 85,655

[52] U.S. Cl. ..............................307/251, 307/202, 307/318, 317/235 UA

[51] Int. Cl. ....................................H03k 17/60, H03k 17/74

[58] Field of Search ...................307/202, 251, 318; 317/235

[56] References Cited

UNITED STATES PATENTS 3,248,572 4/1966 Widmer .............................307/318 X 3,543,052 11/1970 Kahng................................307/318 X 3,549,911 12/1970 Scott..................................307/251 X

*Primary Examiner*—John S. Heyman

*Attorney*—R. J. Guenther and Arthur J. Torsiglieri

[57] ABSTRACT

The gate voltage of an insulated gate switching transistor is controlled by means of a pair of reverse biased Schottky barrier diodes connected in mutual series aiding electrical relationship. A common node or terminal between these diodes is connected to the gate of the transistor and to an electrical switch, in order to provide means for varying the total electrical impedance across one or the other of the diodes, and thereby to turn the transistor between the "ON" and "OFF" states thereof.

10 Claims, 2 Drawing Figures

PATENTED MAY 23 1972 3,665,218

INVENTOR
J. M. ANDREWS JR.
BY D Caplan
ATTORNEY

CONTROL CIRCUIT FOR INSULATED GATE FIELD EFFECT TRANSISTORS

FIELD OF THE INVENTION

This invention relates to the field of solid state electronic switching circuits, and more particularly to networks for protecting and regulating insulated gate field effect transistors.

BACKGROUND OF THE INVENTION

Insulated gate field effect transistors (IGFET's) are useful in switching circuits and are characterized by an extremely high input impedance, since the gate is insulated from the source-to-drain channel in the transistor. Therefore, the impedance of the gate control network can be made correspondingly high, at a consequent saving of standby electrical power. Moreover, the extremely high input impedance of insulated gate transistors makes possible the use of variable capacitance type switching controls in the gate circuit with relatively low values of capacitance.

In the prior art, gate voltage control networks for controlled IGFET's have included high impedance resistors, as well as auxiliary control IGFET's, in order to bias the controlled IGFET. However, the fabrication of such resistors or auxiliary IGFET's, especially in integrated circuit configurations, is costly and difficult. In addition, the gate of the controlled IGFET is subjected to undesirable voltage excursions due to static charge accumulations. Moreover, in the case of pushbutton variable-capacitance type switches, it is desirable to have nonsymmetric current-voltage characteristics in order to afford a relatively fast capacitance discharge during the portion of the cycle when the pushbutton is released (i.e., a fast reset time period).

SUMMARY OF THE INVENTION

The gate of a controlled insulated gate switching transistor, such as a field effect transistor (IGFET which feeds a load) is controlled by means of a pair of reverse biased Schottky diodes. These diodes are connected in an electrical series aiding relationship to a standby gate voltage supply. The common node or terminal between the diodes is connected to the gate of the IGFET and to a mechanically operated switch, such as a pushbutton, which varies the electrical capacitance or resistance across one of the diodes. Thereby, high impedance voltage-control of the gate of the IGFET can be obtained. In addition, the gate of the controlled IGFET is protected against deleterious voltage excursions caused, for example, by a static electric discharge, by means of breakdown of one of the Schottky diodes. The voltage at which this breakdown occurs can be controlled by suitable design of these diodes. In addition, in combination with a pushbutton variable-capacitance type switch, the desired relatively fast discharge time is provided during the release of the pushbutton, at which time the Schottky diode is driven into forward conduction by reason of the accumulation of electrical charge acquired during the "ON" state of the circuit.

In a specific embodiment of invention, an IGFET switch, in accordance with the above principles, is incorporated into an integrated circuit. This circuit is controlled by an external pushbutton, and is fabricated in a single silicon wafer of one conductivity type, coated with an insulating silicon dioxide layer. The IGFET is provided by means of a pair of diffused regions of conductivity type opposite from that of the bulk of the wafer. These regions serve as source and drain, to which ohmic contacts are made through a pair of apertures in the oxide layer. A metal plate, located on the oxide layer and over the channel between the source and drain, serves as the gate electrode of the IGFET. The gate voltage of the IGFET is controlled by a pair of Schottky diodes which are formed by appropriately selected metal (or metal-like) Schottky barrier contacts to the semiconductor wafer through another pair of apertures in the oxide layer. The magnitudes and the ratio of the cross sections of these barrier contacts controls the current-regulation and gate voltage bias of the IGFET during operation. Advantageously, the same metal or metal-like material is used for both of these Schottky barrier contacts, since the current through a Schottky diode is very sensitive to barrier height (exponential dependence). A pushbutton type of variable capacitance switch connects the common terminal between the Schottky diodes to the battery supplying a reverse voltage bias to these diodes. Beam leads typically are used for all external connection and electrical access to the IGFET network thus formed.

BRIEF DESCRIPTION OF THE DRAWINGS

This invention, together with its features, objects, and advantages can be better understood from the following Detailed Description when read in conjunction with the drawing in which.

Figure 1:
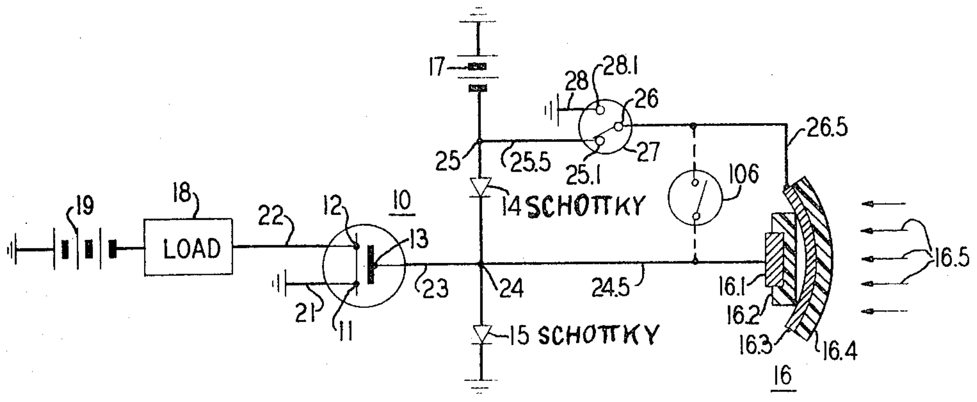
FIG. 1 is a circuit diagram of an IGFET switching circuit, in accordance with a specific embodiment of the invention.

In the drawing, the symbols P and N designate, respectively, moderately P-type and N-type conductivity semiconductor; while the symbols $P^+$ and $N^+$ designate, respectively, more strongly P-type and N-type conductivity semiconductor typically by at least an order of magnitude.

DETAILED DESCRIPTION

In the circuit shown in FIG. 1, a controlled IGFET 10 has a source terminal 11, a drain terminal 12, and a gate terminal 13. The drain terminal 12 is connected serially by lead 22 through an electrical load 18 and a voltage source 19 to a ground. The source terminal 11 is also grounded by lead 21. The gate terminal 13 is electrically connected by lead 23 to a common node or terminal 24 between a pair of reverse biased, front to back (series aiding) Schottky diodes 14 and 15. Reverse bias to these diodes is supplied by a battery 17.

A pushbutton type variable capacitance switch 16 is formed by a stationary metal plate 16.1, coated with a dielectric layer 16.2 thereon, and a metallized mylar or phosphor bronze metal diaphragm 16.3. The average distance from the diaphragm 16.3 to the plate 16.1 can be diminished by an applied force supplied, for example, manually from an operator (indicated by the arrows 16.5). An insulating layer 16.4 coats the contact surface of the diaphragm 16.3, to protect the circuit from stray voltages of the operator, and to protect the operator. The diaphragm 16.3 is electrically connected to a single-pole double-throw switch 27. A terminal 25.1 of the switch 27 is connected by wire lead 25.5 to a common terminal 25 of the negative terminal of the battery 17 and the diode 14. Another terminal 28.1 of the switch 27 is grounded by lead 28. The plate 16.1 is electrically connected to the common terminal 24 between diodes 14 and 15 by a wire lead 24.5.

As an alternative to the variable capacitance type of switch 16, a single-pole single-throw switch 106 can be used. This switch 106 can take the form of a key type pushbutton switch or a knife switch, as indicated in FIG. 1. The switch 106 has an open and a closed position, in order to break and make contact between the common terminal 24 and the switch 27.

The IGFET 10 can take the form, for example, of an "enhancement"(induced inversion layer) type of transistor, having a $P^+NP^+$ conductivity structure; so that this transistor is "ON" when the gate voltage is more negative than a threshold, and is "OFF" otherwise. The Schottky diodes 14 and 15 are each designed with a breakdown voltage of about 20 volts, to pRotect the transistor 10, and with an impedance ratio such that the voltage at the common node 24 is less negative than the threshold when the gate circuit is in equilibrium (i.e., when the diaphragm 16.4 is not being pushed, but is in its stable relaxed position). Thus, the transistor 10 is "OFF" in this equilibrium gate circuit condition when the switch 27 is connected to terminal 25.1. When sufficient force is applied to the diaphragm 16.3 and it is moved toward the plate 16.1, the voltage potential of the common node 24 goes more negative due to current flow produced by the charging of the varying capacitance of the capacitor formed by the plate 16.1, the dielectric layer 16.2 and the diaphragm 16.3. Thus, the transistor 10 is "ON" for some time period during and after the motion of the diaphragm 16.3 toward the plate 16.1. This time period is determined by the time constant of the capacitance of the switch 16 in the gate circuit. Typically, this time constant is about 30 seconds, but can be varied as desired by varying the total of the impedances of both of the diodes 14 and 15 (keeping their relative impedance fixed), or by changing the equilibrium capacitance of the switch 16. Finally, when the force is removed from the diaphragm 16.3 and it moves back to its equilibrium position, although the capacitance of the switch 16 varies thereby, the direction of any discharging currents is such as to maintain the transistor 10 in its "OFF" condition.

In case the knife switch 106 (or other make-break type contact switch) is used as shown (by the dotted lines) in FIG. 1, instead of the variable capacitance type switch 16, the operation is similar to that described above, except that the transistor 10 is always "OFF" when the switch 106 is open and always "ON" when it is closed. Moreover, by placing the switch 27 in the position in which contact is made with the grounded terminal 28.1 (instead of terminal 25.1), in the circuit shown in FIG. 1, then the "ON" and "OFF" cycles of the transistor 10 are reversed; that is, when the switch 106 is closed (or the switch 16 pushed), the transistor 10 turns "OFF", and when the switch 106 is open (or the switch 16 released) the transistor 10 turns "ON". When it is not desired to have this reversible cycle feature, the switch 27 can be omitted and the lead 26.5 permanently connected either to terminal 25 or to ground, depending upon the type of cycle desired.

It is clear that the function of the switches 16 and 106, in any event, is to vary the total electrical impedance across diode 14 or 15, depending upon the position of the switch 27.

Figure 2:
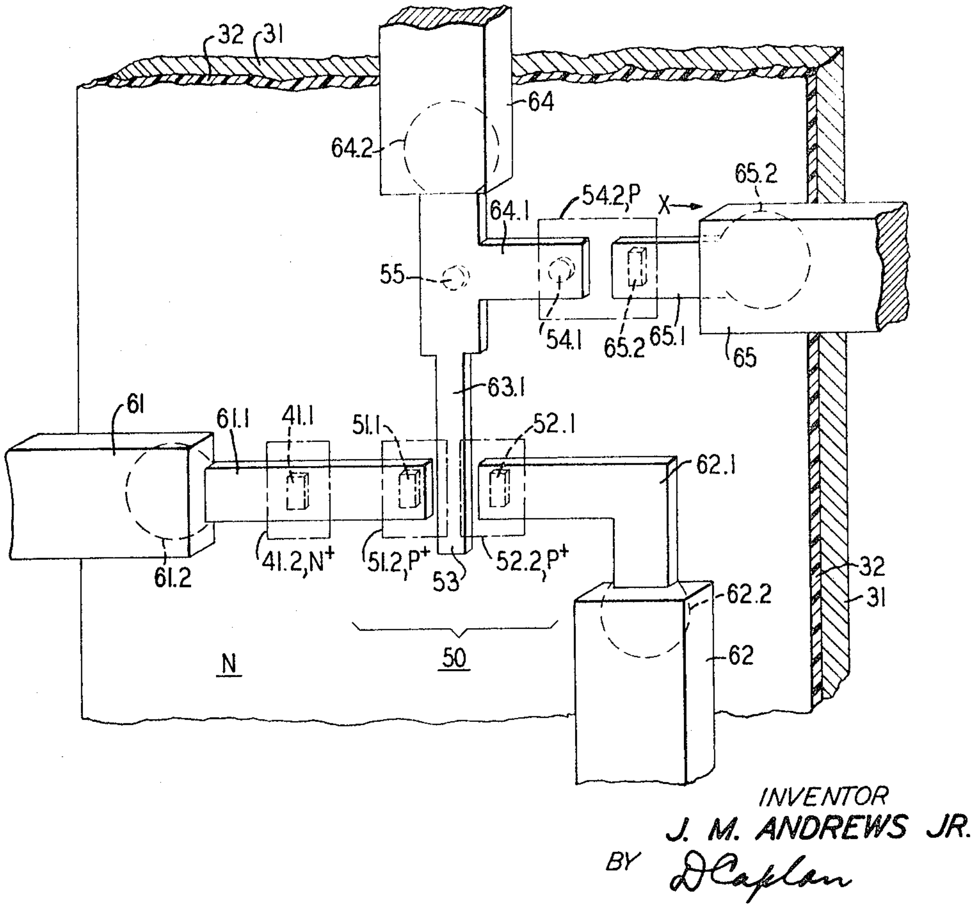
FIG. 2 is a perspective bottom view, partly in cross section, of an integrated transistor circuit according to a specific embodiment of this invention.

The circuit shown in FIG. 1 can be incorporated in an integrated circuit type of configuration, such as that shown in bottom perspective view in FIG. 2. Referring to FIG. 2, a semiconductor substrate wafer 31 is typically N-conductivity type silicon having a net significant donor impurity concentration of the order of $10^{15}$ per $cm^3$, and a thickness of the order of 10 mils. The bottom surface of the substrate 31 is coated with an insulating layer 32, typically silicon dioxide having a thickness of the order of 1 micron. Preferably, the semiconductor wafer 31 is monocrystalline.

A grounded beam lead 61 is connected by an electrode 61.1 through apertures 41.1 and 51.1 to an $N^+$ conductivity type zone 41.2 and to a $P^+$ conductivity type zone 51.2. These zones 41.2 and 51.2 are typically formed in the wafer 31 by diffusion or implantation of well-known donor and acceptor impurities therein. The $N^+$ zone 41.2 typically has a net significant donor concentration of at least of the order of $10^{20}$ per $cm^3$. The lateral dimensions of zone 41.2 are typically about 2 mil x 1½ mil, while the thickness of this zone 41.2 is typically in the range of about 2 to 3 micron. Zone 41.2 thus provides ohmic contact between the lead 61.1 and the substrate wafer 31. On the other hand, the $P^+$ zone 51.2 typically has a net significant acceptor impurity concentration of the order of $10^{19}$ per $cm^3$. The $P^+$ zone 51.2 typically has about the same dimensions as $N^+$ zone 41.2. The $P^+$ zone 51.2 serves as the "source" region of an integrated IGFET transistor 50. In addition, this transistor 50 also includes the $P^+$ zone 52.2, serving as the "drain" region thereof. Conveniently, the $P^+$ zone 52.2 has the same impurity concentration and dimensions as the $P^+$ zone 51.2, and the closest distance between these zones 51.2 and 52.2 is typically of the order of 0.5 mil; thereby defining therebetween a channel region 53 for the IGFET transistor 50, in a region of the semiconductor wafer 31 contiguous with the interface of the wafer 31 and the insulating coating 32. The depth of this channel region 53 is controlled by the voltage potential of an underlying electrode 63.1. The voltage of this electrode 63.1 in turn is determined by the voltage (not shown) applied to a beam lead 64 in physical contact with the electrode 63.1. On the other hand, electrical contact to the $P^+$ zone 52.2 is provided by an electrode 62.1 in physical contact with this zone 52.2 through an aperture 52.1 in the insulating layer 32. External electrical contact of an electrical load (not shown) to the electrode 62.1 in turn is provided by a beam lead 62 in physical contact with this electrode and the load.

An electrode 64.1, which is a physical extension of electrode 63.1, makes Schottky barrier contact to a P-type zone 54.2 on the bottom surface of the wafer 31 through an aperture in the insulating layer 32 by means of metal or metal-like Schottky electrode 54.1. Electrode 63.1 makes a Schottky barrier contact to the N-type wafer 31 through an aperture in the insulating layer 32 by means of metal or metal-like Schottky electrode 55. Typically, the P zone 54.2 has a square-shaped lateral contour of the order of $(2\ mil)^2$, a depth in the range of about 2 to 3 micron, and a net significant acceptor impurity concentration of the order of $10^{16}$ per $cm^3$. Since the type of semiconductor conductivity encountered by the electrode 55 and 54.1 are opposite from each other, the Schottky diodes formed thereby are in front to back (series aiding) electrical relationship. External contact to the electrode 64.1 is furnished by the beam lead 64; whereas external electrical contact to the Schottky diode formed by the electrode 54.1 is made by means of a beam lead 65 through an electrode 65.1 in contact with the P zone 54.2. Advantageously, this contact of electrode 65.1 with the P zone 54.2 is afforded by a metal or metal-like electrode 65.2 in contact with the P zone 54.2 through an aperture in the insulating coating 32. This contact forms a Schottky diode which is forward biased. Protection of the transistor 50 against any stray electrically negative going voltage overloads on the beam lead 65 is afforded by reason of the reverse breakdown of the Schottky diode formed by the surface barrier contact of the electrode 55 with the N wafer 31.

Although not shown in FIG. 2, it should be obvious that the beam lead 64 (equivalent to the wire lead 24.5 in FIG. 1) is to be connected to an electrical switch (of the type 16 or 106) and that the beam lead 65 (equivalent to terminal 25 in FIG. 1) is to be connected to a negative terminal of a D.C. supply and to a terminal of another electrical switch (of the type 27).

The metal-like Schottky-electrodes 55, 54.1, and 65.2 typically are compound nickel silicide. The difference in the barrier heights of the Schottky diodes formed particularly by electrodes 54.1 and 55 are compensated by the ratio of areas of the contacts. Alternatively, other metal-like materials, such as zirconium disilicide may be used for the formation of these Schottky electrodes. The relative cross-section area of electrodes 55 and 54.1 determines the bias voltage of the gate electrode 63.1, while the absolute value of these cross sections determines the total impedance of the input gate network. Thus, by adjusting with the ratio of these cross sections and the absolute values thereof, any arbitrary combination of values of equilibrium gate bias voltage and input impedance may be obtained. Just as the Schottky diodes 14 and 15, the Schottky diodes formed by electrodes 54.1 and 55 also protect the gate of the transistor 50 from stray voltage overloads, by reason of the phenomenon of reverse breakdown in Schottky diodes. As known in the art, this breakdown voltage can be controlled, for example, by the concentration of impurity doping in the silicon semiconductor adjacent to the Schottky electrodes. Typically, the cross sections of these electrodes 54.1 and 55 are both of the order of 0.5 mil in diameter. Moreover, the breakdown voltage of the Schottky diode formed by the electrode 55 can be decreased independently, by increasing the donor concentration locally in the silicon wafer 31 in the region of contact with this electrode 55, to $10^{16}$ per $cm^3$ for example. However, the cross section of the Schottky electrode 65.2 is advantageously much larger than that of the Schottky electrodes 54.1 and 55 so that negligible voltage drop occurs in the Schottky diode formed by this electrode 65.2. To illustrate, the electrode 65.2 typically has a cross section of the order of 0.5 mil × 1.5 mil.

The electrodes 61.1, 62.1, 63.1, 64.1, and 65.1 typically are vapor deposited layers of titanium-platinum-gold, for example, as described in *Bell System Technical Journal*, Vol. 45, page 233 (1966). The beam leads 61, 62, 64, and 65 are in contact with these electrodes as indicated in FIG. 2.

Although the invention has been described in detail in terms of specific embodiments, it should be understood that they are merely illustrative of the invention, and that various modifications can be made by those skilled in the art without departing from the scope of the invention. For example, a "depletion" type of IGFET, ("ON" at zero bias) in which the gate voltage also controls the density of minority charge carriers between the source and drain, can be used as an alternative to the "enhancement"type of IGFET described in detail above. Likewise, other semiconductors such as gallium arsenide or germanium can be used instead of silicon in conjunction with donor and acceptor impurity concentrations appropriate thereto, as well as appropriate Schottky barrier metal or metal-like electrodes, as should now be obvious to the worker skilled in the art. Also, gold wire leads can be used instead of beam leads; and the device shown in FIG. 2 can be bonded to a ceramic substrate for mechanical support and rigidity, as should also now be obvious to the worker skilled in the art.

Finally, when a large number of separately controllable electronic switches are desired in a single silicon wafer without any beam lead crossovers, then the ground contact to the wafer is advantageously made to the topside of the wafer, whereas the P zone 54.2 is elongated in the $x$ direction (indicated by the arrow just above zone 54.2) across the region spanned by the corresponding IGFET's in the $x$ direction, and a single beam lead contact 65 thereto is used to provide external connection to this P zone.

What is claimed is:

1. An electrical network which comprises:

a. a switching transistor having an insulated gate electrode;

b. a pair of Schottky barrier diodes connected in a mutual series-aiding electrical relationship, adapted for the application of a reverse voltage bias to both diodes of the pair;

c. a common node between the diodes to whch the gate electrode is also connected; and d. means for varying the electrical impedance across one of the diodes, in order to vary the electrical current passing through the transistor to an electrical load, the impedance ration of the diodes being such that the voltage at the common node is below the threshold gate voltage when said means is in a first impedance condition, and said reverse bias being a D.C. voltage.

2. The electrical network recited in claim 1 in which the transistor is an insulated gate field effect transistor.

3. The electrical network recited in claim 1 in which the said means include a mechanically operated switch.

4. An electrical network which comprises:

a. a switching transistor having an insulated gate electrode;

b. a pair of Schottky barrier diodes connected in mutual series-aiding electrical relationship, adapted for the application of a reverse voltage bias to both diodes of the pair;

c. a common node between the diodes to which the gate electrode is also connected; and d. variable capacitor means for varying the electrical impedance across one of the diodes, in order to vary the electrical current through the transistor to an electrical load.

5. The network recited in claim 4 in which the capacitor includes a metallized mylar diaphragm.

6. The network recited in claim 4 in which the capacitor includes a phosphor bronze diaphragm.

7. An electrical network which comprises:

a. a switching transistor having an insulated gate electrode;

b. a pair of Schottky barrier diodes connected in a mutual series-aiding electrical relationship, adapted for the application of a reverse voltage bias to both diodes of the pair, in which the Schottky barrier diodes are formed by a pair of metal or metal-like electrodes in surface barrier contact respectively with a pair of zones of mutually opposite conductivity type on a major surface of a semiconductor wafer;

c. a common node between the diodes to which the gate electrode is also connected; and d. means for varying the electrical impedance across one of the diodes, in order to vary the electrical current passing through the transistor to an electrical load.

8. The electrical network recited in claim 7 in which the diodes are electrically connected together by an electrode which is disposed upon an insulating layer on the said major surface.

9. The electrical network recited in claim 7 in which the metal-like electrodes are essentially nickel silicide and the semiconductor is essentially silicon.

10. The electrical network recited in claim 7 in which the metal-like electrodes are essentially zirconium disilicide and the semiconductor is silicon.

* * * * *